(12) United States Patent
Kim et al.

(10) Patent No.: US 8,536,602 B2
(45) Date of Patent: Sep. 17, 2013

(54) LIGHT EMITTING DEVICE, METHOD OF MANUFACTURING THE SAME, LIGHT EMITTING DEVICE PACKAGE, AND LIGHTING SYSTEM

(75) Inventors: Sung Kyoon Kim, Seoul Square (KR); Myeong Soo Kim, Seoul Square (KR); Woo Sik Lim, Seoul Square (KR)

(73) Assignee: LG Innotek Co., Ltd., Seoul (KR)

( * ) Notice: Subject to any disclaimer, the term of this patent is extended or adjusted under 35 U.S.C. 154(b) by 194 days.

(21) Appl. No.: 13/071,922

(22) Filed: Mar. 25, 2011

(65) Prior Publication Data

US 2011/0254036 A1    Oct. 20, 2011

(30) Foreign Application Priority Data

Apr. 19, 2010    (KR) .................. 10-2010-0036072

(51) Int. Cl.
*H01L 33/00*    (2010.01)

(52) U.S. Cl.
USPC ............... 257/98; 257/99; 257/79; 257/13; 257/88; 257/91; 257/E33.067

(58) Field of Classification Search
USPC .............. 257/E33.067, 98–99, 79, 88, 13, 257/91; 438/42
See application file for complete search history.

(56) References Cited

U.S. PATENT DOCUMENTS

| | | | |
|---|---|---|---|
| 2010/0025684 A1* | 2/2010 | Shinohara et al. | 257/49 |
| 2010/0155746 A1* | 6/2010 | Ibbetson et al. | 257/88 |
| 2010/0163901 A1* | 7/2010 | Fudeta | 257/98 |
| 2011/0254036 A1* | 10/2011 | Kim et al. | 257/98 |

FOREIGN PATENT DOCUMENTS

| | | |
|---|---|---|
| JP | 2009-164648 A | 7/2009 |
| KR | 10-2006-0057090 A | 5/2006 |
| KR | 10-2008-0067536 A | 7/2008 |
| KR | 10-2008-0089860 A | 10/2008 |
| KR | 10-2009-0022286 A | 4/2009 |

* cited by examiner

*Primary Examiner* — Eugene Lee
*Assistant Examiner* — Elias M Ullah
(74) *Attorney, Agent, or Firm* — McKenna Long & Aldridge LLP

(57) ABSTRACT

Disclosed is a light emitting device. The light emitting device includes a light emitting structure layer including a first conductive type semiconductor layer, an active layer on the first conductive type semiconductor layer, and a second conductive type semiconductor layer on the active layer, a first light extracting structure formed on an outer portion of the first conductive type semiconductor layer and having a plurality of side surfaces and a plurality of upper surfaces formed in a step structure, and a transmissive layer on the first light extracting structure of the first conductive type semiconductor layer.

20 Claims, 7 Drawing Sheets

LIGHT EMITTING DEVICE, METHOD OF MANUFACTURING THE SAME, LIGHT EMITTING DEVICE PACKAGE, AND LIGHTING SYSTEM

The present application claims priority of Korean Patent Application No. 10-2010-0036072 filed on Apr. 19, 2010, which is hereby incorporated by reference in its entirety as if fully set forth herein.

BACKGROUND

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include a semiconductor material having a compositional formula of $In_xAl_yGa_{1-x-y}N$ ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED or the LD using the semiconductor material is mainly used for the light emitting device to provide the light. For instance, the LED or the LD is used as a light source for various products, such as a keypad light emitting part of a cellular phone, an electric signboard, and an illumination device.

SUMMARY

The embodiment provides a light emitting device having a novel light extracting structure.

The embodiment provides a light emitting device in which a light extracting structure is formed on a side surface of at least one semiconductor layer closer to a substrate than an active layer is.

The embodiment provides a light emitting device including a light extracting structure and a transmissive layer having a refractive index lower than that of a semiconductor layer on a side surface of the semiconductor layer between a substrate and an active layer.

The embodiment provides a light emitting device package including a light emitting device and a lighting system.

According to the embodiment, the light emitting device including a light emitting structure layer including a first conductive type semiconductor layer, an active layer on the first conductive type semiconductor layer, and a second conductive type semiconductor layer on the active layer, a first light extracting structure disposed on an outer portion of the first conductive type semiconductor layer and including a plurality of side surfaces and a plurality of upper surfaces formed in a step structure, and a transmissive layer on the first light extracting structure of the first conductive type semiconductor layer.

According to the embodiment, the light emitting device includes a substrate, a light emitting structure layer including a first conductive type semiconductor layer on the substrate, an active layer on the first conductive type semiconductor layer, and a second conductive type semiconductor layer on the active layer, a first light extracting structure formed at an outer peripheral portion of the first conductive type semiconductor layer and having a plurality of upper surfaces and a plurality of side surfaces formed in a step structure, and a transmissive layer on the first light extracting structure of the first conductive type semiconductor layer, wherein the upper surfaces provided at the outer peripheral portion of the first conductive type semiconductor layer are Ga-face.

DETAILED DESCRIPTION OF THE EMBODIMENTS

Figure 1:
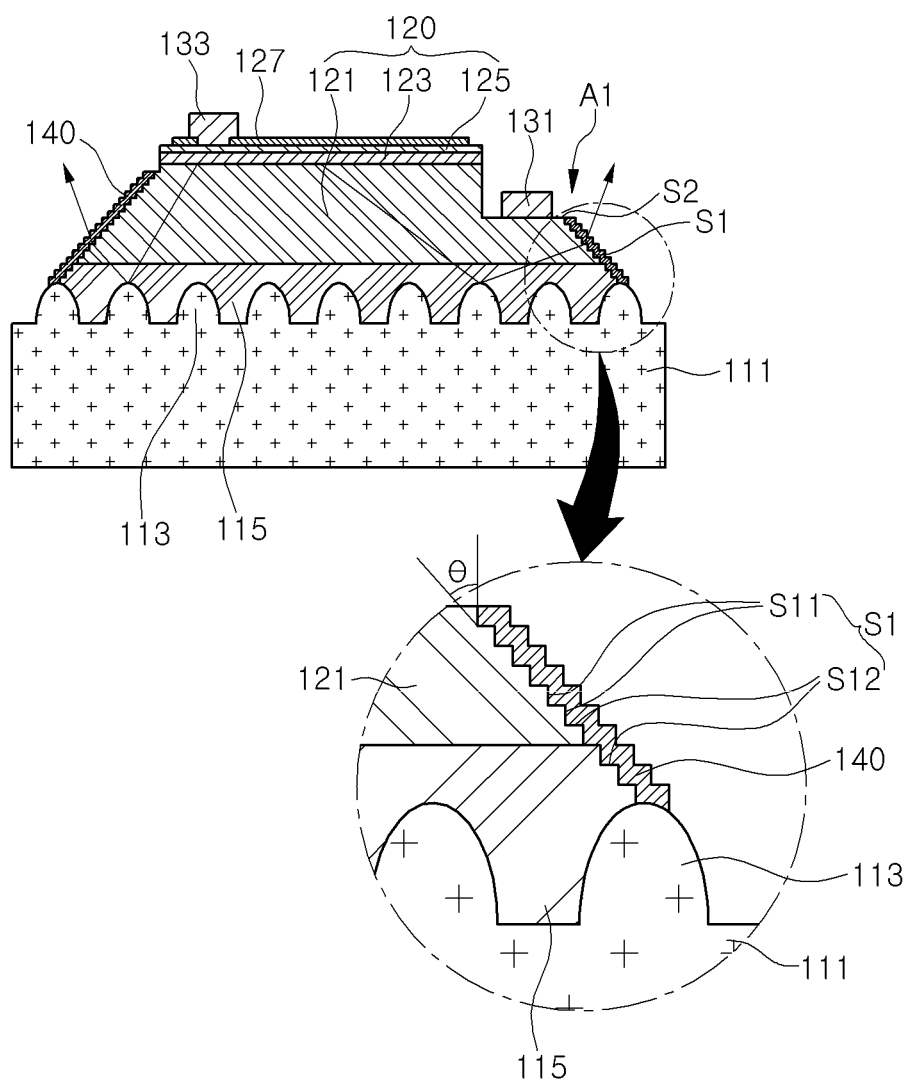
FIG. 1 is a side sectional view showing a semiconductor light emitting device according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, embodiments will be described with reference to accompanying drawings.

Figure 2:
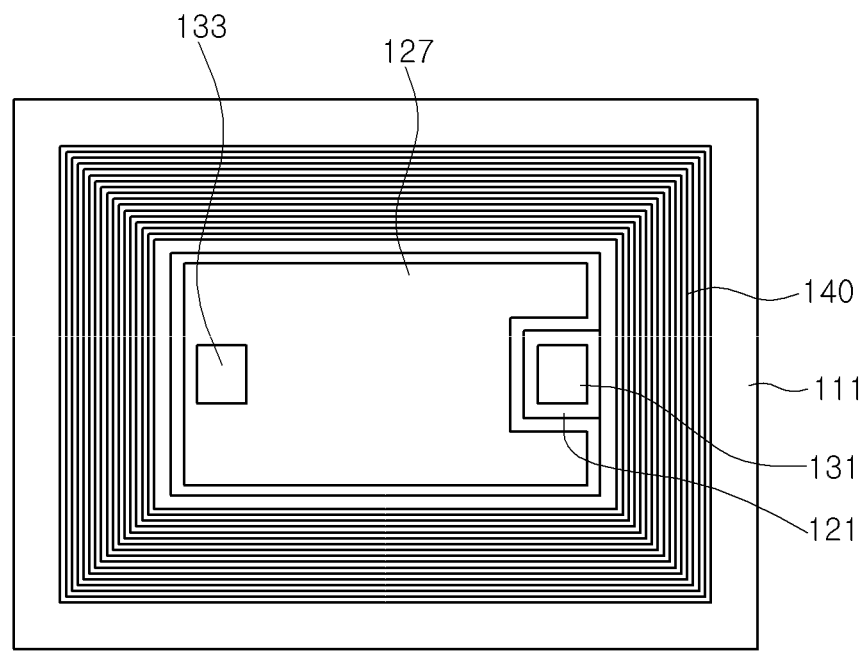
FIG. 2 is a plan view of FIG. 1.

FIG. 1 is a side sectional view showing a light emitting device according to a first embodiment, and FIG. 2 is a plan view of FIG. 1.

Referring to FIG. 1, a light emitting device 100 includes a substrate 111, a first semiconductor layer 115, a first conductive type semiconductor layer 121, an active layer 123, and a second conductive type semiconductor layer 125.

The substrate 111 may includes an insulating substrate or a conductive substrate. For example, the substrate 111 may include at least one of Al2O3, SiC, Si, GaAs, GaN, ZnO, Si, GaP, InP, and Ge. The substrate 111 may include an insulating and transparent substrate including sapphire.

The substrate 111 has a concavo-convex structure 113, and the concavo-convex structure 113 may be formed on at least one of top and bottom surfaces of the substrate 111. Preferably, the concavo-convex structure 113 may be formed at an upper portion of the substrate 111, and may include at least one of an uneven pattern, a texture pattern, and a roughness pattern. At least one pattern of the concavo-convex structure 113 may include a strip shape or a convex lens shape.

The concavo-convex structure 113 may include a plurality of convex portions further protruding higher than the top surface of the substrate 111 due to the etching process of the substrate 111. According to another embodiment, the concavo-convex structure 113 may include material different from material of the substrate 111 between the substrate 111 and the first semiconductor layer 115.

The concavo-convex structure 113 may change the critical angle of light incident into the first semiconductor layer 115 or the substrate 111, so that external quantum efficiency can be improved.

The first semiconductor layer 115 is formed on the substrate 111, and may have at least one layer or a plurality of patterns by using group II to VI compound semiconductors. The first semiconductor layer 115 may include a semiconductor layer by using group III-V compound semiconductors. For instance, the first semiconductor layer 115 may include at least one selected from the group consisting of GaN, InN, AlN, InGaN, AlGaN, InAlGaN, and AlInN. The first semiconductor layer 115 may preferably include a compound semiconductor having a compositional formula of $In_xAl_yGa_{1-x-y}N$ ($0 \leq x \leq 1, 0 \leq y \leq 1, 0 \leq x+y \leq 1$). For instance, the first semiconductor layer 115 may include an oxide such as a ZnO layer.

The first semiconductor layer 115 may include a buffer layer, and the buffer layer can reduce a lattice constant mismatch between a nitride semiconductor and the substrate 101. The thickness of the buffer layer may be in the range of about 100 nm to about 500 nm.

The first semiconductor layer 115 may include an undoped semiconductor layer, and may reduce the defects between the substrate 111 and the first semiconductor layer 115. The undoped semiconductor layer includes an undoped nitride-based semiconductor, and is intentionally not doped with conductive dopants. The undoped semiconductor layer has electrical conductivity remarkably lower than that of the first semiconductor layer 115. For example, the undoped semiconductor layer may include an undoped GaN layer and may have the first conductive characteristic. The undoped semiconductor layer may have a thickness of about 1 μm to 3 μm.

The first semiconductor layer 115 may include a laminated structure of the buffer layer and an undoped semiconductor layer provided on the buffer layer, and the thickness of the first semiconductor layer 115 may be in the range of about 1 μm to about 4 μm.

The first semiconductor layer 115 may include a superlattice structure in which different semiconductor layers are alternately aligned with each other, and may have at least two stack structures of InGaN/GaN layers. In addition, the first semiconductor layer 115 can reduce lattice constant mismatch with respect to the substrate 111. The first semiconductor layer 115 may be removed, but the embodiment is not limited thereto.

The first conductive type semiconductor layer 121 may be formed on the first semiconductor layer 115. The first conductive type semiconductor layer 121 may have a single layer structure or a multiple layer structure, and may be doped with the first conductive dopants.

The first conductive type semiconductor layer 121 may include compound semiconductors of group III-V elements. For instance, the first conductive type semiconductor layer 121 may be selected from the group consisting of GaN, AlN, AlGaN, InGaN, InN, InAlGaN, AlInN, AlGaAs, GaP, GaAs, GaAsP, and AlGaInP. The first conductive type semiconductor layer 121 may include a semiconductor material having a compositional formula of $In_xAl_yGa_{1-x-y}N$ ($0 \leq x \leq 1, 0 \leq y \leq 1, 0 \leq x+y \leq 1$). The first conductive type semiconductor layer 121 includes an N type semiconductor layer, and the N type semiconductor layer includes first conductive dopants, for example, N type dopants such as Si, Ge, Sn, Se, and Te.

In addition, the first conductive type semiconductor layer 121 may include a superlattice structure including different semiconductor layers are stacked. The superlattice structure includes the stack structure of GaN/InGaN or GaN/AlGaN. The superlattice structure may include at least two pairs of different semiconductor layers, which are alternately stacked with each other and have a thickness of a few Å or above.

The thickness of the first conductive type semiconductor layer 121 may be thicker than that of the second conductive type semiconductor layer 125 or the active layer 123. In other words, among the layers 121, 123, and 125 of a light emitting structure layer 120, the semiconductor layer closer to the substrate 111 may have a thicker thickness. The thickness of the first conductive type semiconductor layer 121 may be in the range of about 1 μm to about 5 μm.

An electrode contact portion A1 of the first conductive type semiconductor layer 121 includes at least one step structure, and the electrode contact portion A1 may be spaced apart from side surfaces of the second conductive type semiconductor layer 125 and the active layer 123.

The electrode contact portion A1 has a second upper surface S2 closer to the upper surface of the substrate 111 than that of the first conductive type semiconductor layer 121. The area of the second upper surface S2 may be 7% or less of the area of the lower surface of the first conductive type semiconductor layer 121. The area of the second upper surface S2 may vary according to chip sizes. A first electrode 131 is formed on the second upper surface S2, and the first electrode 131 includes at least one selected from the group consisting of Ti, Al, In, Ta, Pd, Co, Ni, Si, Ge, Ag and Au on the second upper surface S2. The first electrode 131 may have a single layer structure or a multiple layer structure. The first semiconductor layer 115 and the first conductive type semiconductor layer 121 may include a GaN-based semiconductor layer, and the second upper surface S2 is a Ga-Face serving as an electrode contact surface. The second upper surface S2 may have a rough structure such as a concavo-convex structure, but the embodiment is not limited thereto. The Ga-face represents a Ga-face surface or a Ga-face structure of a GaN semiconductor layer.

The first electrode 131 includes a pad, and the pad may be connected to a current spreading pattern such as a finger structure or an arm structure. The lower surface of the first electrode 131 is positioned lower than the upper surface of the first conductive type semiconductor layer 121.

The first electrode 131 is not formed in the step structure A1 of the first conductive type semiconductor layer 121, but connected through a via structure. However, the embodiment is not limited thereto.

A light extracting structure S1 is formed at an outer peripheral portion of at least one of the semiconductor layers 115 and 121 between the substrate 111 and the active layer 123. The light extraction structure S1 may be formed at least one side of an outer peripheral portion of each semiconductor layer 115 or/and 121. The light extracting structure S1 includes a step structure having two stages. The light extracting structure S1 may be formed at an outer portion of the first conductive type semiconductor layer 121 or may extend to an outer portion of the first semiconductor layer 115.

The light extracting structure S1 includes a plurality of third upper surfaces S11 and a plurality of fourth side surfaces S12. The three-upper surfaces S11 and the four-side surfaces S12 are alternately aligned with each other.

As shown in FIG. 2, the third upper surfaces S11 and the fourth side surfaces S12 may be formed in the shape of a loop along outer peripheral portions of the first conductive type semiconductor layer 121 and the first semiconductor layer 115. The loop shape may be continuous or discontinuous.

Each of the third upper surfaces S11 is a Ga-face, and the light extracting structure S1 may have a plurality of Ga-faces.

For example, the third upper surfaces S11 are parallel to each other. The third upper surfaces S11 may have different widths or the same width. The third upper surfaces S11 may include a flat surface or a rough surface.

The fourth side surface S12 may be perpendicular to the third upper surface S11, or may be inclined with respect to the third upper surface S11 at a predetermined angle. The inclined angle may be in the range of about 15° to about 75° about a normal line to the lower surface of the substrate 111.

The light extracting structure S1 may have a continuous concavo-convex structure or a curved surface structure, but the embodiment is not limited. The light extracting structure S1 may be formed on the whole region of the outer portion of the first conductive type semiconductor layer 121 as shown in FIG. 2 except for the electrode contact portion A1.

The outer portion of the first conductive type semiconductor layer 121 may be inclined at a predetermined angle θ with reference to a normal line to the lower surface of the first conductive type semiconductor layer 121 or the lower surface of the substrate 111. The angle θ is an angle between a virtual line linking the step structure and the reference line, and may be in the range of about 15° to about 75°. The virtual line may link vertexes to each other or may link the step regions to each other.

The first conductive type semiconductor layer 121 has a width gradually wider as the first conductive type semiconductor layer 121 is farther away from the active layer 123. Accordingly, the first conductive type semiconductor layer 121 has the narrowest width in the upper surface thereof, and the widest width in the lower surface thereof.

A transmissive layer 140 may be formed at least one outer portion of the first conductive type semiconductor layer 121 and the first semiconductor layer 115. The transmissive layer 140 may be formed on the light extracting structure S1, and includes a transmissive material having a refractive index lower than that of the nitride semiconductor. The refractive index of the nitride semiconductor is about 2.5, and the refractive index of the transmissive layer 140 may be in the range of about 1.5 to about 2.4.

The transmissive layer 140 includes a single layer structure or a multiple layer structure. The transmissive layer 140 may include a rough layer. An outer surface S4 of the transmissive layer 140 includes a rough surface, so that the critical angle of emitted light can be changed. Since the transmissive layer 140 is formed on the light extracting structure S1, the transmissive layer 140 may include an inclined layer.

The transmissive layer 140 may selectively include transmissive insulating material and/or conductive material having transmittance. The transmissive layer 140 may include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $Al_2O_3$, $Si_3N_4$, $TiO_2$, $ZrO_2$, $CeF_3$, $HfO_2$, MgO, $Ta_2O_5$, ZnS, and $PbF_2$. The refractive index may vary according to the material constituting the transmissible layer 140.

As shown in FIG. 2, the transmissive layer 140 may have a roughness having a step pattern or a continuous curve pattern.

The transmissive layer 140 may have a thickness of a few μm or less, or preferably, a thickness of 2 μm or less. The transmissive layer 140 may have a thickness thinner than that of the first conductive type semiconductor layer 121. The transmissive layer 140 may be spaced apart from the side surface of the active layer 123. According to another embodiment, if the transmissive layer 140 includes insulating material, the transmissive layer 140 may make contact with the side surface of the active layer 123, but the embodiment is not limited thereto.

As shown in FIG. 1, a part of light emitted from the active layer 123 travels toward the substrate 111. Since the light incident into the substrate 111 is refracted or reflected by the concavo-convex structure 113 of the substrate 111, the critical angle of light incident into the substrate 111 may be changed. The light reflected or transmitted by the concavo-convex structure 113 of the substrate 111 may be refracted or transmitted by the light extracting structure S1 of the first semiconductor layer 115 and the first conductive type semiconductor layer 121, and may be extracted to the outside through the transmissive layer 140.

The transmissive layer 140 has a refractive index lower than that of the semiconductor layer, and makes contact with the light extracting structure S1 of the first semiconductor layer 115 and the first conductive type semiconductor layer 121, so that the transmissive layer 140 does not reflect the light, but transmits the light. Accordingly, the light extraction efficiency can be improved. In addition, the light extracting structure S1 of at least one semiconductor layer 121 having a thicker thickness among semiconductor layers of the light emitting device 100 and the transmissive layer 140 are formed, so that the light extraction efficiency can be maximized.

The light extracting structure S1 may be classified into a first light extracting structure formed at an outer peripheral portion of the first conductive type semiconductor layer 121 and a second light extracting structure formed at an outer peripheral portion of the first semiconductor layer 115. In addition, upper surfaces and side surfaces of the first and second light extracting structures may be formed in the step structure at the outer peripheral portions of the semiconductor layers 115 and 121. Each upper surface may include a Ga-face. The transmissive layer 140 may be provided on the first light extracting structure and/or the second light extracting structure.

The active layer 123 is formed on the first conductive type semiconductor layer 121. The active layer 123 may have a single quantum well structure, a multiple quantum well (MQW) structure, a quantum wire structure or a quantum dot structure. The active layer 123 may have a stack structure of well/barrier layers by using a compound semiconductor material of group III-V elements. For example, the well layer may include a semiconductor layer having a compositional formula of $In_xAl_yGa_{1-x-y}N$ ($0 \leq x \leq 1$, $0 \leq y \leq 1$, $0 \leq x+y \leq 1$), and the barrier layer may include a semiconductor layer having a compositional formula of $In_xAl_yGa_{1-x-y}N$ ($0 \leq x \leq 1$, $0 \leq y \leq 1$, $0 \leq x+y \leq 1$).

The active layer 123 may include at least one of an InGaN/GaN structure, an InGaN/AlGaN structure, and an InGaN/InGaN structure. The barrier layer may include material having bandgap greater than that of the well layer, but the embodiment is not limited thereto. The active layer 123 may emit light in a visible band or an ultra violet band.

A first conductive clad layer may be formed between the first conductive type semiconductor layer 121 and the active layer 123, and may include an N type semiconductor layer. The first conductive clad layer may include a GaN-based semiconductor. The first conductive clad layer has bandgap greater than that of the barrier layer of the active layer 123 and confines carriers.

A second conductive clad layer may be formed between the active layer 123 and the second conductive type semiconductor layer 125, and may include a GaN-based semiconductor.

The second conductive clad layer has a band gap greater than that of the barrier layer of the active layer 123 and confines carriers.

The second conductive type semiconductor layer 125 is formed on the active layer 123. The second conductive type semiconductor layer 125 includes group III-V compound semiconductors and are doped with second conductive dopants. If the second conductive type semiconductor layer 125 is a P type semiconductor layer, the second conductive type semiconductor layer 125 may include one of compound semiconductors such as GaN, InN, AlN, InGaN, AlGaN, InAlGaN, and AlInN, and the second conductive dopants include P type dopants such as Mg, Zn, Ca, Sr, and Ba.

Preferably, the second conductive type semiconductor layer 125 may include a semiconductor material having a compositional formula of $In_xAl_yGa_{1-x-y}N$ ($0 \leq x \leq 1$, $0 \leq y \leq 1$, $0 \leq x+y \leq 1$). The second conductive type semiconductor layer 125 has a single layer structure or a multiple layer structure. If the second conductive type semiconductor layer 125 has the multiple layer structure, the second conductive type semiconductor layer 125 may have a superlattice structure such as AlGaN/GaN or have a stack structure in which layers having different dopant concentration are stacked.

A portion of an upper surface of the second conductive type semiconductor layer 125 may serve as an electrode contact surface. The upper surface of the second conductive type semiconductor layer 125 may include a rough surface.

A third conductive type semiconductor layer may be formed on the second conductive type semiconductor layer 125, and may include a semiconductor layer in the first conductive type having a polarity opposite to that of the second conductive type. The third conductive type semiconductor layer may include one of compound semiconductors such as GaN, InN, AlN, InGaN, AlGaN, InAlGaN, and AlInN. The first conductive type semiconductor layer 121 and the third conductive type semiconductor layer may include an N type semiconductor layer.

The light emitting structure layer 120 includes the first conductive type semiconductor layer 121, the active layer 123, and the second conductive type semiconductor layer 125, or may further include the third conductive type semiconductor layer. The first conductive type semiconductor layer 121 may include a P type semiconductor layer, and the second conductive type semiconductor layer 125 may include an N type semiconductor layer. The light emitting structure layer 120 may include one of an N-P junction structure, a P-N junction structure, an N-P-N junction structure, and a P-N-P junction structure. In the following description, the light emitting structure layer 120 has the second conductive type semiconductor layer 125 as the upper most layer.

A current spreading layer 127 and the second electrode 133 are formed on the second conductive type semiconductor layer 125, and include a transmissive conductive layer or a reflective electrode layer.

Preferably, the current spreading layer 127 may include a transmissive conductive layer, and the transmissive conductive layer may include a material having a refractive index lower than that of the nitride semiconductor. The transmissive conductive layer may have an area smaller than that of the top surface of the second conductive type semiconductor layer 125. For example, the transmissive conductive layer may have an area corresponding to 50% or more of the area of the top surface of the second conductive type semiconductor layer 125.

The current spreading layer 127 may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), ZnO, IrOx, RuOx, and NiO. The reflective layer may include material having 50% or more of reflectance. For example, the reflective layer may metallic material selected from the group consisting of Al, Ag, Pd, Rh, Pt, and Ir. An at least one of the current spreading layer 127 and the second conductive type semiconductor layer 125 has a light extracting structure including a roughness surface or uneven surface.

The second electrode 133 is formed on the current spreading layer 127, and at least a part of the second electrode 133 may directly make contact with the second conductive type semiconductor layer 125. The second electrode 133 includes at least one pad, and may include a current spreading pattern such as an arm structure or a finger structure connected to the pad.

The second electrode 133 includes at least one selected from the group consisting of Ag, Ag alloy, Ni, Al, Al alloy, Rh, Pd, Ir, Ru, Mg, Zn, Pt, Au, and Hf. The second electrode 133 may include non-transmissive metal having the characteristics of ohmic contact, an adhesive layer, and a bonding layer, but the embodiment is not limited thereto.

According to the embodiment, the light extracting structure S1 and the transmissive layer 140 are provided at an outer portion of a semiconductor layer under the active layer 123, for example, at an outer portion of the semiconductor layers 115 and 121 between the substrate 111 and the active layer 123, so that the light extraction efficiency can be improved at the side surface of the light emitting device 100.

FIGS. 3 to 6 are views showing the manufacturing process of the light emitting device 100 of FIG. 1.

Figure 3:
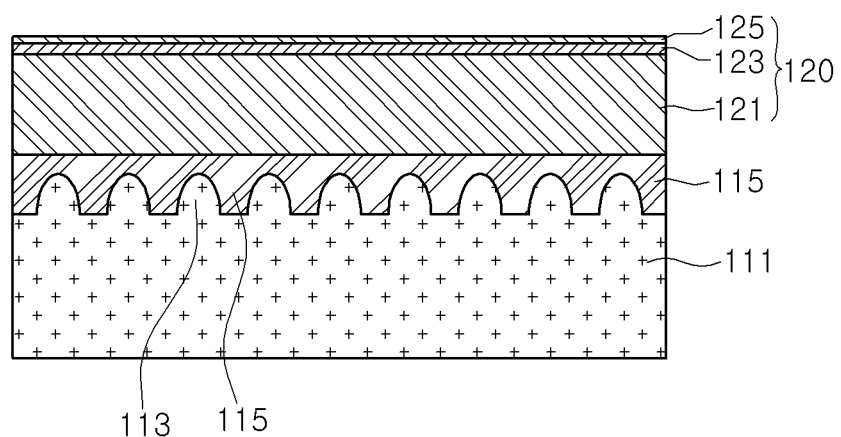
FIGS. 3 to 6 are view showing a method of manufacturing a semiconductor light emitting device according to the embodiment.

Referring to FIG. 3, the substrate 111 is loaded into growth equipment, and a compound semiconductor layer of group II to VI elements is formed on the substrate 111.

The substrate 111 may include an insulating substrate or a conductive substrate. For instance, the substrate 111 may be selected from the group consisting of $Al_2O_3$, GaN, SiC, ZnO, Si, GaP, InP, $Ga_2O_3$, and GaAs. The concavo-convex structure 113 may be formed at the upper portion of the substrate 111. The concavo-convex structure 113 changes the critical angle of light to improve the light extraction efficiency.

The growth equipment may be selected from the group consisting of E-beam evaporator, PVD (physical vapor deposition), CVD (chemical vapor deposition), PLD (plasma laser deposition), dual-type thermal evaporator, sputtering, and MOCVD (metal organic chemical vapor deposition). However, the embodiment is not limited to the above growth equipment.

The substrate 111 may be provided thereon with a layer or a pattern by using compound semiconductors of group II to VI elements.

The first semiconductor layer 115 is formed on the substrate 111. The first semiconductor layer 115 may be formed by using compound semiconductors of group III-V elements. The first semiconductor layer 115 may include a buffer layer, and the buffer layer includes a nitride semiconductor, thereby reducing the lattice constant mismatch from the substrate 111. The first semiconductor layer 115 may include an undoped semiconductor layer, and the undoped semiconductor layer may improve the crystalline of a semiconductor layer. The undoped semiconductor layer has electrical conductivity remarkably lower than that of the first conductive type semiconductor layer. For example, the undoped semiconductor layer may include an undoped GaN layer, and may have a first conductive characteristic.

The first semiconductor layer 115 may include the stack structure of the buffer layer and the undoped semiconductor layer, and may have a thickness of about 1 μm to 4 μm.

The light emitting structure layer 120 is formed on the first semiconductor layer 115, and includes the first conductive type semiconductor layer 121, the active layer 123, and the second conductive type semiconductor layer 125. The first conductive type semiconductor layer 121 is interposed between the first semiconductor layer 115 and the active layer 123, and the active layer 123 is interposed between the first conductive type semiconductor layer 121 and the second conductive type semiconductor layer 125. The second conductive type semiconductor layer 125 is provided on the active layer 123.

The first conductive type semiconductor layer 121 may have a single layer structure or a multiple layer structure, and is doped with first conductive dopants The first conductive type semiconductor layer 121 may include compound semiconductors of group III-V elements. For instance, the first conductive type semiconductor layer 121 may be selected from the group consisting of GaN, AlN, AlGaN, InGaN, InN, InAlGaN, AlInN, AlGaAs, GaP, GaAs, GaAsP, and AlGaInP. The first conductive type semiconductor layer 121 may include a semiconductor material having a compositional formula of $In_xAl_yGa_{1-x-y}N$ ($0 \leq x \leq 1$, $0 \leq y \leq 1$, $0 \leq x+y \leq 1$). The first conductive type semiconductor layer 121 includes an N type semiconductor, and the N type semiconductor layer includes N type dopants such as Si, Ge, Sn, Se, and Te as the first conductive dopants.

The first conductive type semiconductor layer 121 may include a superlattice structure in which heterogeneous semiconductor layers are stacked. The superlattice structure includes a GaN/InGaN structure or a GaN/AlGaN structure. The superlattice structure may include at least two pairs of heterogeneous semiconductor layers, which are alternately stacked with each other, and have a thickness of a few Å or above.

The active layer 123 is formed on the first conductive type semiconductor layer 121. The active layer 123 may have a single quantum well structure, a multiple quantum well (MQW) structure, a quantum wire structure or a quantum dot structure. The active layer 123 may have a stack structure of well/barrier layers by using a compound semiconductor material of group III-V elements. For example, the active layer 123 may include at least one of an InGaN/GaN structure, an InGaN/AlGaN structure, and an InGaN/InGaN structure. The barrier layer may include a material having a bandgap greater than that of the material of the well layer. However, the embodiment is not limited thereto.

The active layer 123 may emit red, blue, or red light in a visible ray band or light in a ultra-violet ray band.

The first conductive clad layer may be formed between the first conductive type semiconductor layer 121 and the active layer 123, and may include an N type semiconductor layer. The first conductive clad layer may include a GaN-based semiconductor. The first conductive clad layer has bandgap greater than that of the barrier layer of the active layer 123 and confines carriers.

The second conductive clad layer may be interposed between the active layer 123 and the second conductive type semiconductor layer 125, and may include a GaN-based semiconductor. The second conductive clad layer has a band gap greater than that of the barrier layer of the active layer 123 and confines carriers.

The first conductive type semiconductor layer 121 may have a thickness thicker than that of another semiconductor layer. The thickness of the first conductive type semiconductor layer 121 may be in the range of about 1 μm to about 5 μm.

The second conductive type semiconductor layer 125 is formed on the active layer 123. The second conductive type semiconductor layer 125 includes group III-V compound semiconductors and are doped with second conductive dopants. If the second conductive type semiconductor layer 125 is a P type semiconductor layer, the second conductive type semiconductor layer 125 may include one of compound semiconductors such as GaN, InN, AlN, InGaN, AlGaN, InAlGaN, and AlInN, and the second conductive dopants include P type dopants such as Mg, Zn, Ca, Sr, and Ba.

Preferably, the second conductive type semiconductor layer 125 may include a semiconductor material having a compositional formula of $In_xAl_yGa_{1-x-y}N$ ($0 \leq x \leq 1$, $0 \leq y \leq 1$, $0 \leq x+y \leq 1$). The second conductive type semiconductor layer 125 has a single layer structure or a multiple layer structure. If the second conductive type semiconductor layer 125 has the multiple layer structure, the second conductive type semiconductor layer 125 may have a superlattice structure such as AlGaN/GaN or have a stack structure in which layers having different dopant concentration are stacked.

A portion of the top surface of the second conductive type semiconductor layer 125 may act as an electrode contact surface.

A third conductive type semiconductor layer may be formed on the second conductive type semiconductor layer 125, and may include a semiconductor layer in the first conductive type having a polarity opposite to that of the second conductive type. The third conductive type semiconductor layer may include one of compound semiconductors such as GaN, InN, AlN, InGaN, AlGaN, InAlGaN, and AlInN. The first conductive type semiconductor layer 121 and the third conductive type semiconductor layer may include an N type semiconductor layer.

The light emitting structure layer 120 includes the first conductive type semiconductor layer 121, the active layer 123, and the second conductive type semiconductor layer 125, or may further include the third conductive type semiconductor layer. The first conductive type semiconductor layer 121 may include a P type semiconductor layer, and the second conductive type semiconductor layer 125 may include an N type semiconductor layer. The light emitting structure layer 120 may include one of an N-P junction structure, a P-N junction structure, an N-P-N junction structure, and a P-N-P junction structure. In the following description, the light emitting structure layer 120 has the second conductive type semiconductor layer 125 as the uppermost layer.

Figure 4:
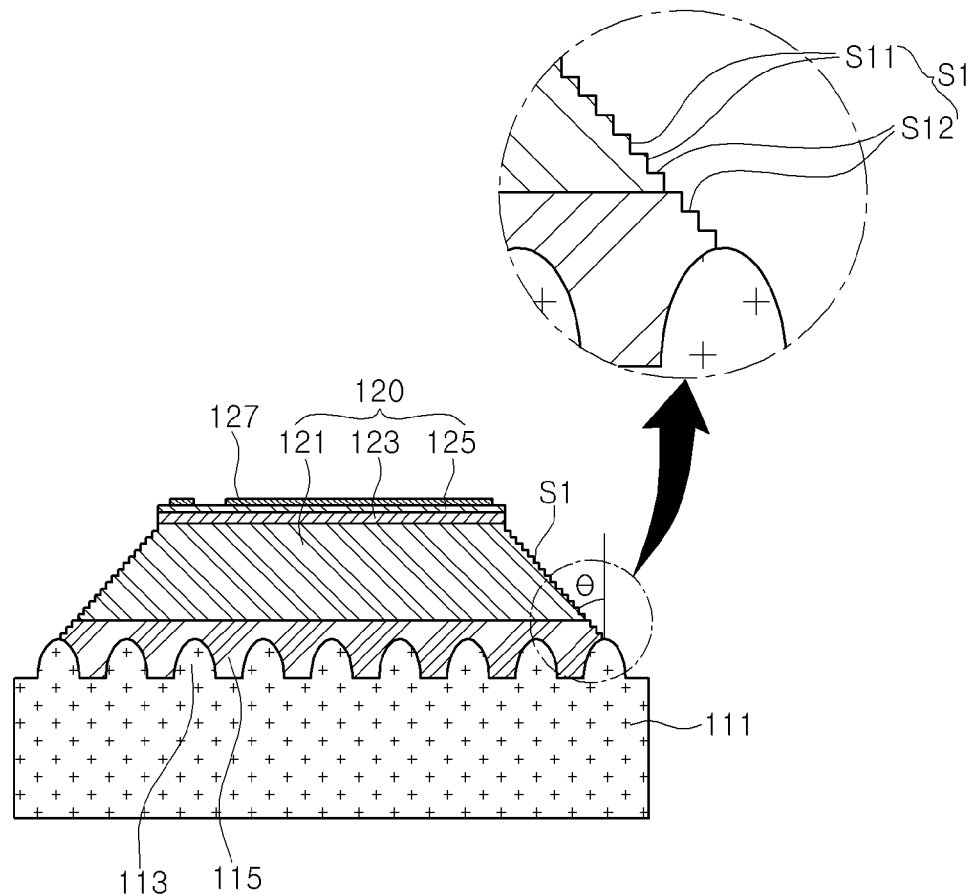

Referring to FIG. 4, the current spreading layer 127 is formed on the second conductive type semiconductor layer 125, and includes a transmissive conductive layer such as metallic oxide material or metallic nitride material. For instance, the current spreading layer 127 may include at least one of ITO, IZO, IZTO, IAZO, IGZO, IGTO, AZO, ATO, GZO (gallium zinc oxide), ZnO, IrOx, RuOx, and NiO The current spreading layer 127 is formed through a deposition scheme or sputtering equipment after forming a mask pattern at a predetermined region. Then, the mask pattern is removed, so that the current spreading layer 127 can be partially open.

An etching process is performed with respect to an outer portion of the light emitting structure layer 120. The etching process may be performed before or after the current spreading layer 127 is formed, but the embodiment is not limited thereto.

According to the first etching process, a wet etching process is performed with respect to a boundary region (channel region) between chips after a mask pattern has been masked. In the first etching process, the wet etching process is performed by using KOH solution and/or a developing solution including TMAH (tetramethylammonium hydroxide)

The first etching process is performed such that the outer peripheral portion of the light emitting structure layer 120 is exposed, and an outer top surface of the substrate 111 can be exposed. The light emitting structure layer 120 may have a narrow upper portion width and a wide lower width through the first etching process. The outer portions of the light emitting structure layer 120 and the first semiconductor layer 115 may be inclined at a predetermined angle θ. The inclination angle θ of the light emitting structure layer 120 may be in the range of 15° to 75° about a normal axis (e.g., optical axis) to the lower surface of the substrate 111.

The inclination angle θ is an angle between the virtual line linking vertexes or the step regions and the normal line.

An outer portion of the light emitting structure layer 120 may include the light extracting structure S1 having a step structure with multiple stages. The light extracting structure S1 extends from the first conductive type semiconductor layer 121 to the first semiconductor layer 115. The light extracting structure S1 may have a step structure in which the upper surfaces S12 and the side surfaces S11 are alternately aligned with each other. The second upper surfaces S11 of the light extracting structure S1 have the form of a Ga-face of a GaN-based semiconductor layer and may be provided on different planes.

The light emitting structure S1 more extends outward as the light emitting structure S1 is closer to the substrate 111. The light emitting structure S1 may have a step structure with at least two stages, and a continuous curve structure having unevenness.

Figure 5:
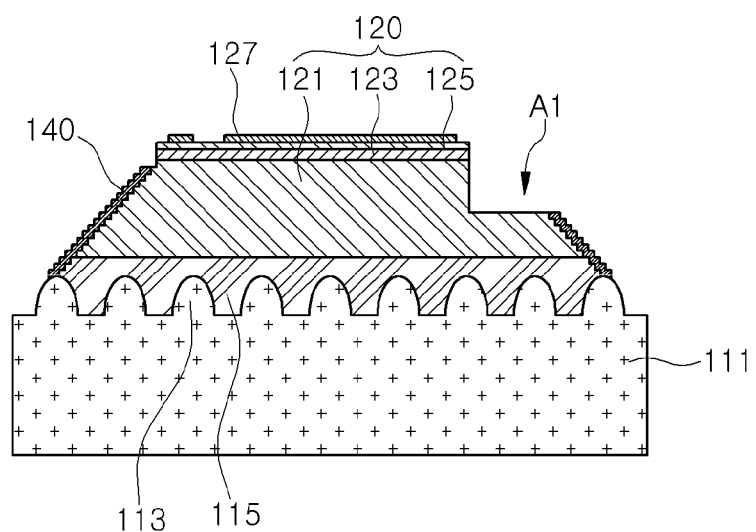

Referring to FIG. 5, the transmissive layer 140 is formed from the outer portion of the first conductive type semiconductor layer 121 to the outer portion of the first semiconductor layer 115. The transmissive layer 140 has a refractive index lower than that of the semiconductor layer. For example, the transmissive layer 140 may include at least one layer having a refractive index in the range of about 1.5 to about 2.4

The transmissive layer 140 may selectively include insulating material having high transmittance or conductive material having high transmittance. The transmissive layer 140 may include at least one of, ITO, IZO, IZTO, IAZO, IGZO, IGTO, AZO, ATO, GZO, Al2O3, Si3N4, TiO2, ZrO2, CeF3, HfO2, MgO, Ta2O5, ZnS, and PbF2. The refractive index may be changed or may have various refractive indexes with the specific range of material. The transmissive layer 140 may be inclined with reference to a normal line to the lower surface of the substrate 111.

The transmissive layer 140 may have a thickness of a few μm or less through a sputtering scheme or a deposition scheme, and may have a rough layer. The transmissive layer 140 may be formed such that the transmissive layer 140 does not make contact with the side surface of the active layer 123. According to another embodiment, if the transmissive layer 140 includes insulating material, the transmissive layer 140 may make contact with the side surface of the active layer 123.

Then, a second etching process is performed. The second etching process is a dry etching process to expose a part of the first conductive type semiconductor layer 121. The exposed region has a step structure. In the exposed region, the first electrode may be formed.

The top surface of the electrode contact portion A1 of the first conductive type semiconductor layer 121 may have a flat surface or a rough surface. The top surface S2 of the electrode contact portion A1 may be provided on a plane different from a plane of the outer portion of the first conductive type semiconductor layer 121, and may be formed in parallel to the top surface of the first conductive type semiconductor layer 121.

In this case, the second etching process and the first etching process may be changed to each other. In addition, the transmissive layer 140 may be formed after the second etching process has been performed. The change of the processes may be achieved within the technical scope of the embodiment.

Figure 6:
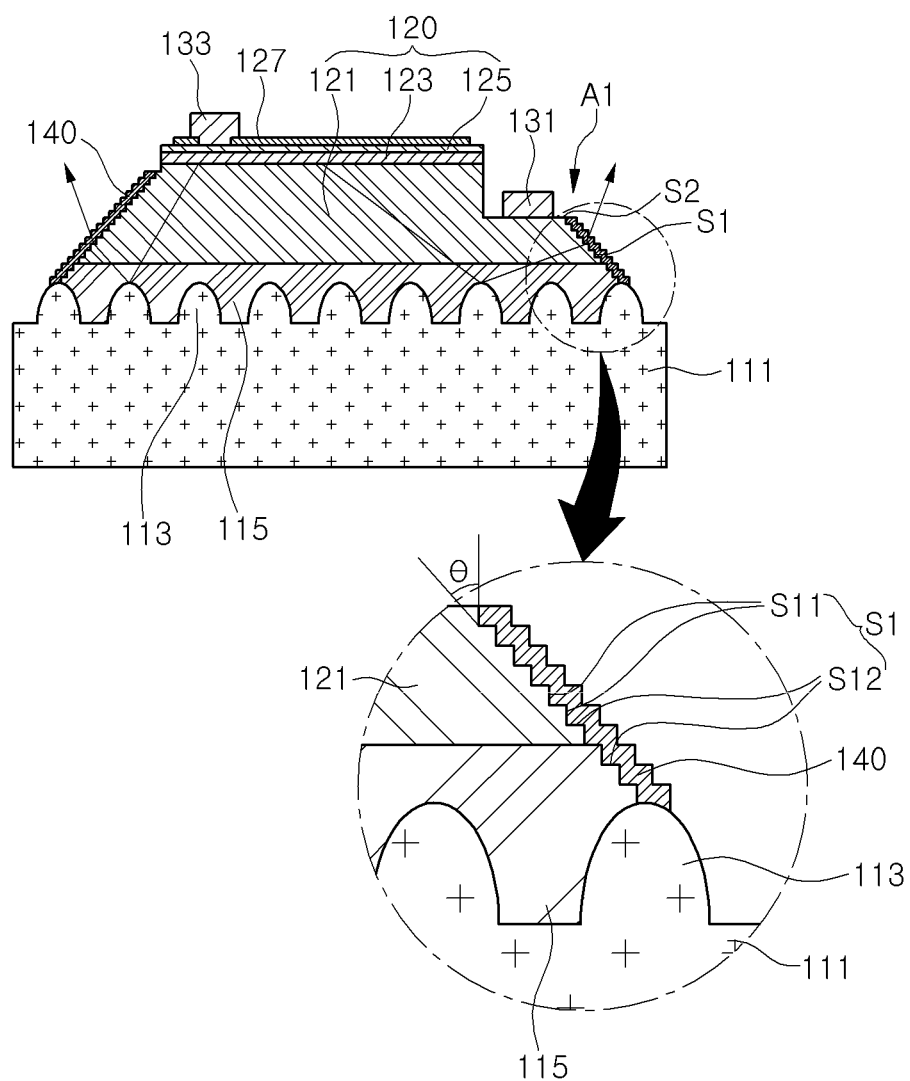

Referring to FIG. 6, the second electrode 133 is formed on the current spreading layer 127, and may make contact with at least one of the current spreading layer 127 and the second conductive type semiconductor layer 125. The first electrode 131 may be formed on the step structure A1 of the first conductive type semiconductor layer 121.

A part of light emitted from the active layer 123 travels toward the substrate 111, and may be refracted or reflected by the concavo-convex structure 113 of the substrate 111. Accordingly, the light emission efficiency can be improved.

A part of light directed to the outside of the light emitting structure layer 120 may be extracted to the outside through the light extracting structure S1 and the transmissive layer 140 formed at the outer portion of the first conductive type semiconductor layer 121 and the first semiconductor layer 115. The transmissive layer 140 reduces the refractive index difference from the nitride semiconductor, so that incident light can be extracted to the outside. The current spreading layer 127 and the transmissive layer 140 more reduce the difference in the refractive index among the semiconductor layers 121, 123, and 125 as compared as the air, so that the internal light can be more smoothly discharged to the outside through the current spreading layer 127 and the transmissive layer 140.

The light extracting structure S1 is formed at the outer portion of the first conductive type semiconductor layer 121 occupying 50% of the thickness of the light emitting structure layer 120, so that the light extraction efficiency can be increased.

Figure 7:
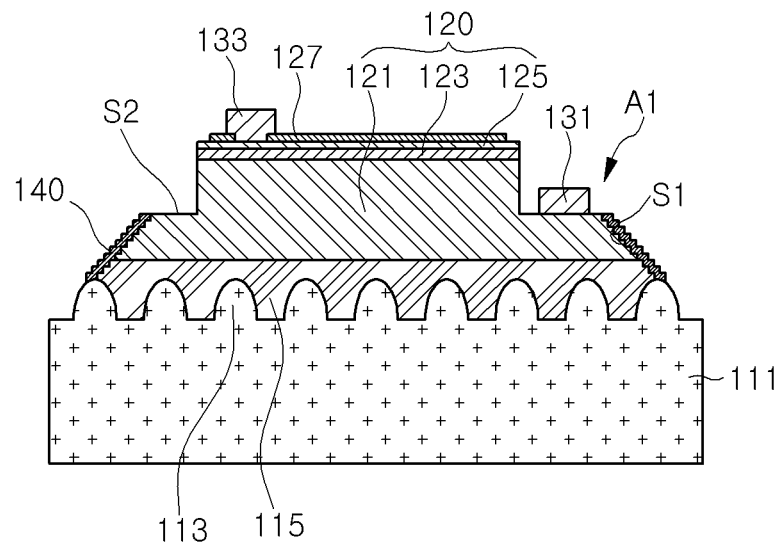
FIG. 7 is a side sectional view showing a semiconductor light emitting device according to a second embodiment.

FIG. 7 is a side sectional view showing a semiconductor light emitting device according to the second embodiment, and the same structure and component identical to those of FIG. 1 will not be further described.

Referring to FIG. 7, the transmissive layer 140 is formed between the step structure A1 of the light emitting structure layer 120 and the substrate 111. The step structure A1 may be formed in a loop shape around the first conductive type semiconductor layer 111.

The transmissive layer 140 may be formed on the semiconductor layer between the step structure A1 and the substrate 111, for example, at a lower portion of the first conductive type semiconductor layer 121 and at an outer portion of the first semiconductor layer 115. The transmissive layer 140 may be formed lower than the step structure A1, and may be formed at a distance of a few tens nm to a few hundreds nm downward from the side surface of the active layer 123

Meanwhile, according to another embodiment, after forming a second electrode part including an ohmic contact layer, a reflective layer, a bonding layer, and a conductive support member on the second conductive type semiconductor layer 125, the substrate, that is, the growth substrate is removed, thereby forming the first electrode. Accordingly, a light emitting device having a vertical electrode structure may be realized. The disclosed transmissive layer may be formed at an outer peripheral portion of the first conductive type semiconductor layer of the light emitting device having the vertical electrode structure. In this case, the light extraction efficiency can be improved.

Figure 8:
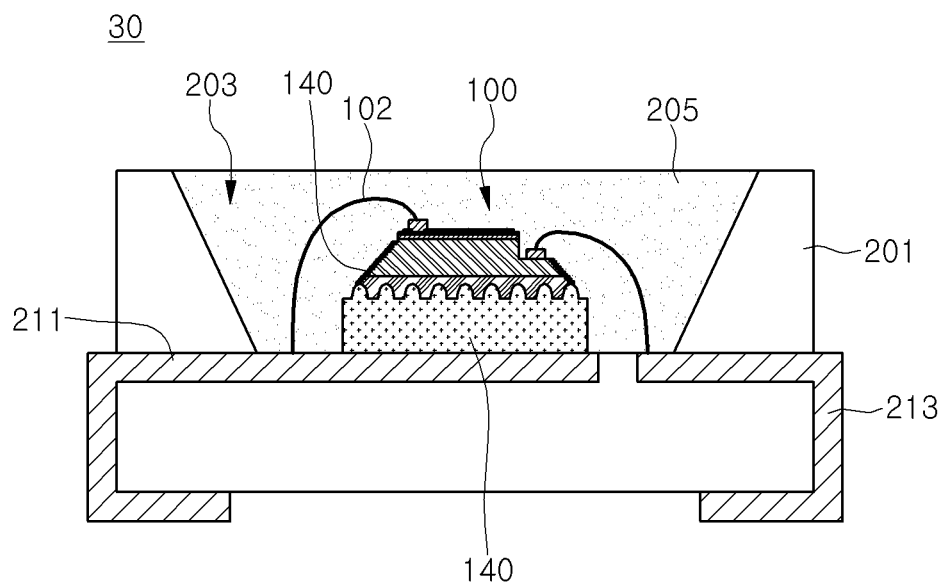
FIG. 8 is a view showing a light emitting deice package including a light emitting device according to the embodiment.

FIG. 8 is a sectional view showing a light emitting device package 30 including a light emitting device 100 according to the embodiment.

Referring to FIG. 8, the light emitting device package 30 includes a body 201, first and second lead electrodes 211 and 213, a molding member 205, and the light emitting device 100 installed in the body 20.

The body 20 may include synthetic resin-based material, ceramic-based material, or a metallic substrate, and may include a cavity 203 having an open upper portion.

The light emitting device 100 disclosed in FIG. 1 is electrically connected to the first and second lead electrodes 211 and 213 provided in the body 201. In this case, the light emitting device 100 may be connected to the first and second lead electrodes 211 and 213 through a plurality of wires 102. The light emitting device 100 may be electrically connected to the first and second lead electrodes 211 and 213 through one of a flip-chip scheme and a die-bonding scheme.

The first and second lead electrodes 211 and 213 include a lead frame or a metallic layer, but the embodiment is not limited thereto.

The first and second lead electrodes 211 and 213 may extend from a lower surface of the cavity 203 to a lower surface of the body 201 through the side surface of the body 201, but the embodiment is not limited thereto.

The light emitting device 100 is covered by the molding member 205. The molding member 205 may include transparent resin material such as silicon or epoxy, and may contain luminescence material. The molding member 205 makes contact with the rough surface of the transmissive layer 140, thereby improving a bonding strength.

Most of light emitted from the internal part of the light emitting device 100 may be extracted through the transmissive layer and the current spreading layer provided at an outer peripheral portion of the light emitting structure layer. The extracted light may be discharged to the outside through the molding member 205. The transmissive layer 140 and the molding member 205 are formed by using the same material or materials that does not make a refractive index difference, so that the light extraction efficiency of the light emitting device 100 may be improved.

The transmissive lens may be additionally provided on the molding member 205, and may directly or indirectly make contact with the molding member 205.

The light emitting device package 30 may include at least one light emitting device or a plurality of light emitting devices according to the embodiments, but the embodiment is not limited thereto. The light emitting device according to the embodiments is mounted on a lead frame or a printed circuit board through a direct die bonding scheme without an additional bonding process, and then may be packaged by using the molding member.

Lighting System

A plurality of light emitting devices or light emitting device packages according to the embodiment are arrayed on a substrate. A light guide plate, a prism sheet, and a diffusion sheet that serve as an optical member may be provided on the path of light emitted from the light emitting devices. The light emitting device package, the substrate, and the optical member may serve as a light unit. The light unit is realized in a top view type or a side view type so as to be provided to a display apparatus such as a portable terminal and a laptop computer. In addition, the light unit may be variously applied to various fields such as a lighting device and an indicator device. According to another embodiment, a lighting system including the light emitting device or the light emitting device package may be realized. For example, the lighting system may include an illumination lamp, a signal lamp, a headlight of a vehicle, and an electric sign board.

Figure 9:
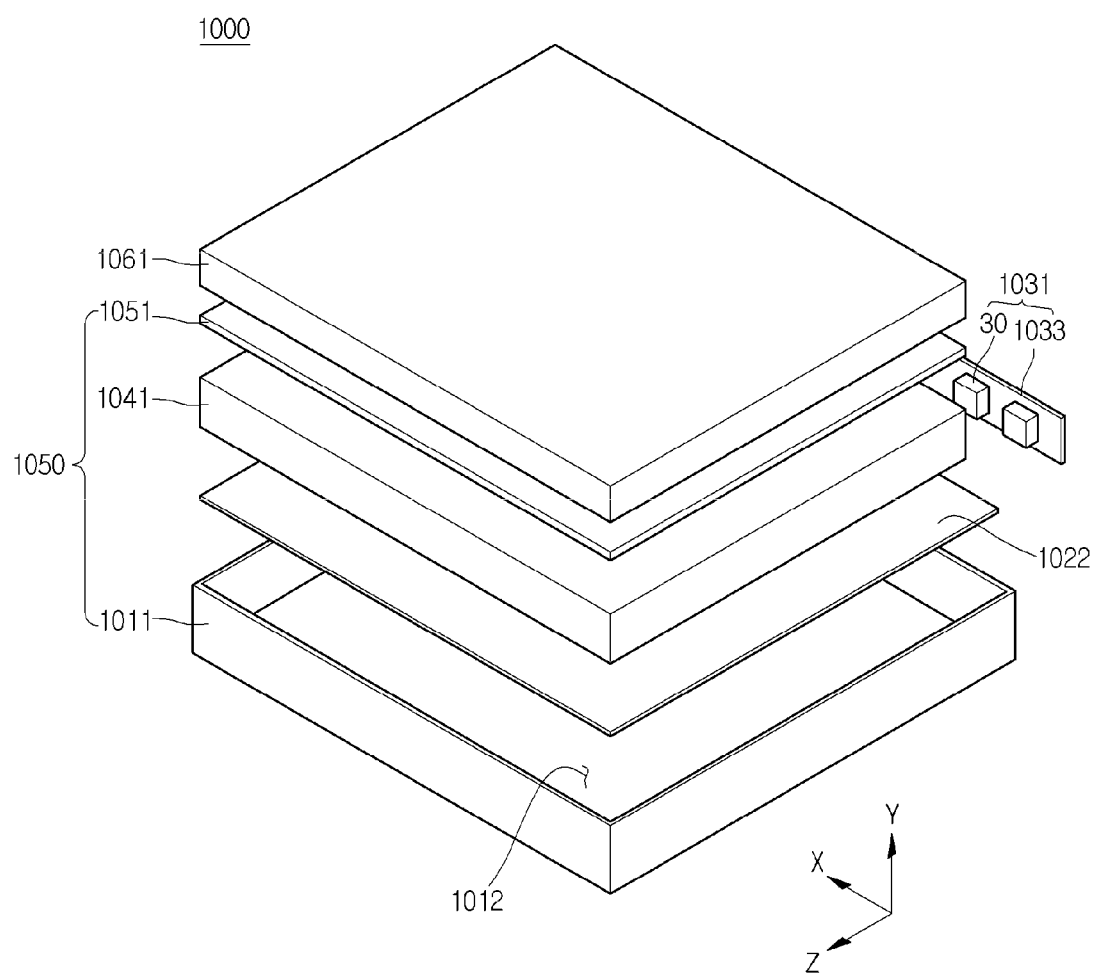
FIG. 9 is a view showing a display apparatus according to the embodiment.
Figure 10:
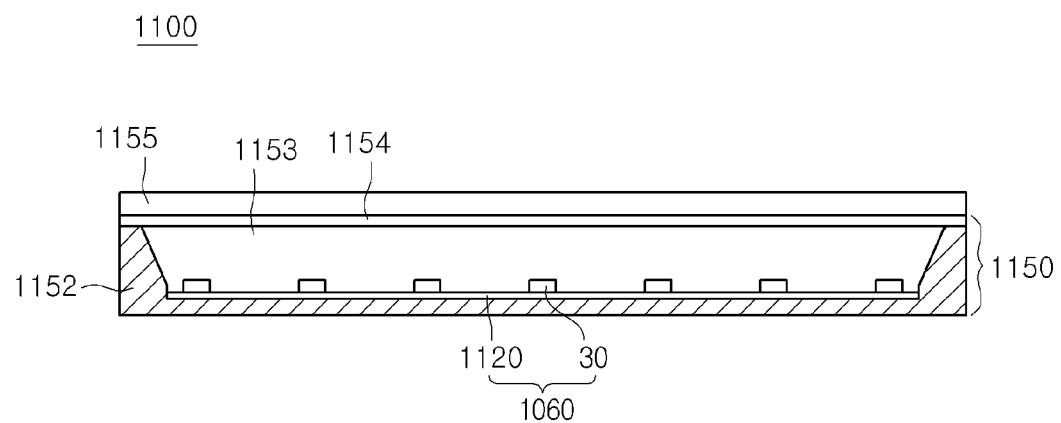
FIG. 10 is a view showing a display apparatus according to another embodiment.
Figure 11:
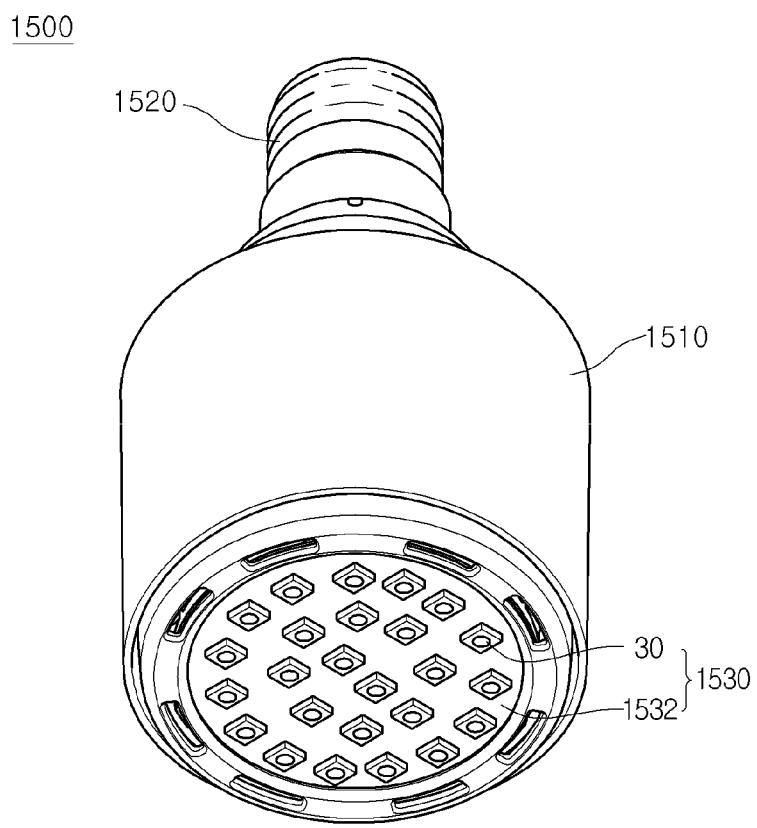
FIG. 11 is a view showing a lighting unit according to the embodiment.

The lighting system may include a display apparatus shown in FIGS. 9 and 10, a lighting device shown in FIG. 11, in addition to a lighting lamp, a signal light, a vehicle headlight, an electronic display, etc.

FIG. 9 is a disassembled perspective view of a display apparatus according to an embodiment.

Referring to FIG. 9, the display apparatus 1000 according to the embodiment may include a light guide panel 1041, a light emitting module 1031 supplying light to the light guide panel 1041, a reflective member 1022 under the light guide panel 1041, an optical sheet 1051 on the light guide panel 1041, a display panel 1061 on the optical sheet 1051, and a bottom cover 1011 receiving the light guide panel 1041, the light emitting module 1031, and the reflective member 1022, but the present disclosure is not limited thereto.

The bottom cover 1011, the reflective sheet 1022, the light guide panel 1041, and the optical sheet may be defined as a light unit 1041.

The light guide panel 1041 functions to transform linear light to planar light by diffusing the linear light. The light guide panel 1041 may be made of a transparent material, and may include one of acryl-series resin such as polymethyl metaacrylate (PMMA), polyethylene terephthlate (PET), poly carbonate (PC), COC, and polyethylene naphthalate resin.

The light emitting module 1031 provides light to at least a side surface of the light guide panel 1041, and finally acts as a light source of a display apparatus.

The light emitting module 1031 may include at least one light emitting module, and provide light directly or indirectly from one side surface of the light guide panel 1041. The light emitting module 1031 may include a board 1033, and a light emitting device package 30 according to embodiments disclosed above, and the light emitting device packages 30 may be arranged apart by a predetermined interval from each other on the board 1033.

The board 1033 may be a printed circuit board (PCB) including a circuit pattern (not shown). The board 1033 may include a metal core PCB (MCPCB), a flexible PCB (FPCB), etc. as well as the general PCB, but the present disclosure is not limited thereto. In the case where the light emitting device package 30 is mounted on a side surface or a heat releasing plate, the board 1033 may be removed. Herein, some of the heat releasing plate may contact an upper surface of the bottom cover 1011.

The plurality of light emitting device packages 30 may be mounted on the board 1033 such that light emitting surfaces of the plurality of light emitting device packages 30 are spaced apart by a predetermined distance from the light guide panel 1041, but the present disclosure is not limited thereto. The light emitting device package 30 may supply light to a light incident part that is one side surface of the light guide panel 1041, directly or indirectly, but the present disclosure is not limited thereto.

The reflective member 1022 may be provided under the light guide panel 1041. The reflective member 1022 reflects light incident from a lower surface of the light guide panel 1041 to allow the reflected light to be directed toward an upper direction, thereby capable of enhancing brightness of the light unit 1050. The reflective member 1022 may be formed of, for example, PET, PC, PVC resin, or the like, but the present disclosure is not limited thereto.

The bottom cover 1011 may receive the light guide panel 1041, the light emitting module 1031, the reflective member 1022, and the like. For this purpose, the bottom cover 1011 may have a receiving part 1012 formed in a box shape a top surface of which is opened, but the present disclosure is not limited thereto. The bottom cover 1011 may be coupled to a top cover, but the present disclosure is not limited thereto.

The bottom cover 1011 may be formed of a metal material or resin material, and may be manufactured by using a process such as a press molding or an injection molding. Also, the bottom cover 1011 may include metallic or nonmetallic material having a high thermal conductivity, but the present disclosure is not limited thereto.

The display panel 1061 is, for example, an LCD panel, and includes first and second transparent substrates facing each other, and a liquid crystal layer interposed between the first and second substrates. A polarizing plate may be attached on at least one surface of the display panel 1061, but the present disclosure is not limited thereto. The display panel 1061 displays information by using light passing through the optical sheet 1051. The display apparatus 1000 may be applied to a variety of mobile terminals, monitors for notebook computers, monitors for lap-top computers, televisions, etc.

The optical sheet 1051 is disposed between the display panel 1061 and the light guide panel 1041, and includes at least one transparent sheet. The optical sheet 1051 may include, for example, at least one of a diffusion sheet, a horizontal and/or vertical prism sheet, and a brightness reinforcing sheet. The diffusion sheet diffuses incident light, the horizontal and/or vertical prism sheet focuses incident light on a display region, and the brightness reinforcing sheet enhances the brightness by reusing lost light. Also, a protective sheet may be disposed on the display panel 1061, but the present disclosure is not limited thereto. Herein, the display apparatus 1000 may include the light guide panel 1041, and the optical sheet 1051 as optical members positioned on a light path of the light emitting module 1031, but the present disclosure is not limited thereto.

FIG. 10 is a cross-sectional view of a display apparatus according to an embodiment.

Referring to FIG. 10, the display apparatus 1100 includes a bottom cover 1152, a board 1120 on which the light emitting device packages 30 disclosed above are arrayed, an optical member 1154, and a display panel 1155.

The board 1120 and the light emitting device package 30 may be defined as a light emitting module 1060. The bottom cover 1152, the at least one light emitting module 1060, and the optical member 154 may be defined as a light unit.

The bottom cover 1152 may be provided with a receiving part, but the present disclosure is not limited thereto.

Herein, the optical member 1154 may include at least one of a lens, a light guide panel, a diffusion sheet, a horizontal and vertical prism sheet, and a brightness reinforcing sheet. The light guide panel may be formed of polycarbonate (PC) or poly methyl methacrylate (PMMA), and may be removed. The diffusion sheet diffuses incident light, the horizontal and vertical prism sheet focuses incident light on a display region, and the brightness reinforcing sheet enhances the brightness by reusing lost light.

The optical member 1154 is disposed on the light emitting module 1060. The optical member 154 transforms light emitted from the light emitting module 1060 to planar light, and performs diffusion, light focusing, and the like.

FIG. 11 is a perspective view of a lighting device according to an embodiment.

Referring to FIG. 11, the lighting unit 1500 may include a case 1510, a light emitting module 1530 equipped in the case 1510, and a connection terminal 1520 equipped in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device package 30 according to the embodiments mounted on the board 1532. The light emitting device package 30 may include a plurality of light emitting device packages which are arrayed apart by a predetermined distance from one another in a matrix configuration.

The board 1532 may be an insulator substrate on which a circuit pattern is printed, and may include, for example, a printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, white color, or silver color.

The at least one light emitting device packages 30 may be mounted on the board 1532. Each of the light emitting device packages 30 may include at least one light emitting diode (LED) chip. The LED chip may include a color LED emitting red, green, blue or white light, and a UV LED emitting ultraviolet (UV).

The light emitting module 1530 may have a combination of various light emitting device packages so as to obtain desired color and luminance. For example, the light emitting module 1530 may have a combination of a white LED, a red LED, and a green LED so as to obtain a high color rendering index (CRI).

The connection terminal 1520 may be electrically connected to the light emitting module 1530 to supply power. The connection terminal 1520 may be screwed and coupled to an external power in a socket type, but the present disclosure is not limited thereto. For example, the connection terminal 1520 may be made in a pin type and inserted into an external power, or may be connected to the external power through a power line.

The light emitting device package according to the embodiment can be applied to the lighting unit. The lighting unit has a structure in which a plurality of light emitting devices or a plurality of light emitting device packages are arranged. In addition, the lighting unit may include an illumination lamp, a signal lamp, a headlight of a vehicle, and an electric sign board.

A method of manufacturing the light emitting device according to the embodiment includes the steps of forming a first conductive type semiconductor layer on a substrate; forming an active layer on the first conductive type semiconductor layer; forming a second conductive type semiconductor layer on the active layer; forming a roughness at an inclined outer side surface of the first conductive type semiconductor layer; forming a flat surface at one side of the first conductive type semiconductor layer; and forming a transmissive layer having a refractive index lower than that of the first conductive type semiconductor layer on the roughness.

The light extraction efficiency of the semiconductor light emitting device according to the embodiment can be improved. The embodiment can improve the reliability for the semiconductor light emitting device. According to the embodiment, the light efficiency of the light emitting device package can be improved.

The embodiments are selectively applicable to another embodiment.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a light emitting structure layer including a first conductive type semiconductor layer, an active layer on the first conductive type semiconductor layer, and a second conductive type semiconductor layer on the active layer;
a first light extracting structure disposed on an outer side of the first conductive type semiconductor layer and including a plurality of side surfaces and a plurality of upper surfaces formed in a step structure;
a transmissive layer on the first light extracting structure of the first conductive type semiconductor layer;
a first semiconductor layer under the first conductive type semiconductor layer; and
a second light extracting structure which is disposed on an outer portion of the first semiconductor layer and includes a plurality of side surfaces and a plurality of upper surfaces formed in a step structure.

2. The light emitting device of claim 1, wherein the transmissive layer further extends on the second light extracting structure of the first semiconductor layer.

3. The light emitting device of claim 1, wherein the transmissive layer has a thickness thinner than a thickness of the first conductive type semiconductor layer.

4. The light emitting device of claim 1, wherein the transmissive layer includes a rough layer on the outer side of the first conductive type semiconductor layer and an outer surface of the rough layer has a roughness.

5. The light emitting device of claim 1, wherein the upper surface of the first light extracting structure is a Ga-face.

6. The light emitting device of claim 1, wherein the first conductive type semiconductor layer has a width which is gradually widened as the first conductive type semiconductor layer is farther away from the active layer.

7. The light emitting device of claim 1, wherein the outer portion of the first conductive type semiconductor layer and the first light extracting structure are inclined with respect to a lower surface of the first conductive type semiconductor layer.

8. The light emitting device of claim 1, wherein the transmissive layer includes conductive material or insulating material.

9. The light emitting device of claim 1, wherein the transmissive layer has a refractive index lower than a refractive index of the first conductive type semiconductor layer.

10. The light emitting device of claim 1, wherein each upper surface of the first light extracting structure is formed in a loop shape along an outer peripheral portion of the first conductive type semiconductor layer.

11. The light emitting device of claim 1, further comprising a electrode contact portion formed in a step structure on at least one outer portion of the first conductive type semiconductor layer and spaced apart from a side surface of the active layer; and a first electrode disposed on the upper surface of the electrode contact portion.

12. A light emitting device comprising:
a substrate;
a light emitting structure layer including a first conductive type semiconductor layer on the substrate, an active layer on the first conductive type semiconductor layer, and a second conductive type semiconductor layer on the active layer;
a first light extracting structure formed at an outer peripheral portion of the first conductive type semiconductor layer and including a plurality of upper surfaces and a plurality of side surfaces formed in a plurality of step structures; and
a transmissive layer on the first light extracting structure of the first conductive type semiconductor layer, wherein the upper surfaces provided at the outer peripheral portion of the first conductive type semiconductor layer are Ga-faces,
wherein the plurality of upper surfaces include at least three upper surfaces and the plurality of side surfaces include at least three side surfaces.

13. The light emitting device of claim 12, further comprising a first semiconductor layer on the substrate; and
a concavo-convex structure including a plurality of convex portions between the substrate and the first semiconductor layer.

14. The light emitting device of claim 13, wherein outer portions of the first semiconductor layer and the first conductive type semiconductor layer are inclined at a predetermined angle with respect to a lower surface of the substrate,
wherein the predetermined angle is in a range of about 15° to about 75° with respect to a lower surface of the substrate, and
wherein the predetermined angle is an angle between a virtual line linking vertexes of the plurality of step structures and the lower surface of the substrate.

15. The light emitting device of claim 13, wherein the first semiconductor layer includes at least one of a buffer layer and an undoped semiconductor layer.

16. The light emitting device of claim 15, wherein a portion of at least one of the plurality of convex portions is located at an outer position than a side surface of the first semiconductor layer.

17. The light emitting device of claim 12, wherein each upper surface of the first light extracting structure is a Ga-face and provided in a loop shape at the outer peripheral portion of the first conductive type semiconductor layer.

18. The light emitting device of claim 12, further comprising:
a first electrode on the first conductive type semiconductor layer;
a current spreading layer including transmissive material on the second conductive semiconductor; and
a second electrode provided on the current spreading layer.

19. The light emitting device of claim 12, wherein the transmissive layer includes at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $Al_2O_3$, $Si_3N_4$, $TiO_2$, $ZrO_2$, $CeF_3$, $HfO_2$, MgO, $Ta_2O_5$, ZnS, and $PbF_2$.

20. The light emitting device of claim 12, wherein the first light extracting structure and the transmissive layer are spaced apart from a side surface of the active layer,
  wherein the transmissive layer includes a rough layer on the outer side of the first conductive type semiconductor layer and an outer surface of the rough layer has a roughness.

* * * * *